(12) United States Patent
Palm et al.

(10) Patent No.: US 8,698,327 B2
(45) Date of Patent: Apr. 15, 2014

(54) SUBSTRATE HANDLER

(75) Inventors: Troy Palm, Eden Prairie, MN (US);
Kevin J. Barr, Inver Grove Heights, MN (US); Ralph P. Sowden, Minneapolis, MN (US); Matthew M. Laberge, Plymouth, MN (US); Andrey MonJoseph, Shakopee, MN (US); Brian Delsey, Farmersville, TX (US); Emily Nordick, Jordan, MN (US); Richard Sobotka, Farmington, MN (US); Chetan Suresh, Apple Valley, MN (US)

(73) Assignee: Rudolph Technologies, Inc., Flanders, NJ (US)

( * ) Notice: Subject to any disclaimer, the term of this patent is extended or adjusted under 35 U.S.C. 154(b) by 0 days.

(21) Appl. No.: 13/352,160

(22) Filed: Jan. 17, 2012

(65) Prior Publication Data

US 2012/0257952 A1 Oct. 11, 2012

Related U.S. Application Data

(63) Continuation-in-part of application No. 11/742,355, filed on Apr. 30, 2007, now Pat. No. 8,097,966, which is a continuation of application No. 10/891,278, filed on Jul. 14, 2004, now Pat. No. 7,316,938.

(60) Provisional application No. 60/487,151, filed on Jul. 14, 2003, provisional application No. 61/567,634, filed on Dec. 7, 2011.

(51) Int. Cl.
*H01L 23/544* (2006.01)

(52) U.S. Cl.
USPC .......................... 257/797; 257/678; 257/798

(58) Field of Classification Search
USPC ........................................ 257/797, 678, 798
See application file for complete search history.

(56) References Cited

U.S. PATENT DOCUMENTS

| | | |
|---|---|---|
| 4,328,553 A | 5/1982 | Fredriksen et al. |
| 4,464,705 A | 8/1984 | Horowitz |
| 4,644,172 A | 2/1987 | Sandland et al. |
| 4,823,394 A | 4/1989 | Berkin et al. |
| 5,091,963 A | 2/1992 | Litt et al. |
| 5,497,381 A | 3/1996 | O'Donoghue et al. |
| 5,592,295 A | 1/1997 | Stanton et al. |
| 5,640,200 A | 6/1997 | Michael |
| 5,641,960 A | 6/1997 | Okubo et al. |
| 5,787,190 A | 7/1998 | Peng et al. |
| 5,822,055 A | 10/1998 | Tsai et al. |
| 5,850,466 A | 12/1998 | Schott |
| 5,856,844 A | 1/1999 | Batterman et al. |
| 5,917,588 A | 6/1999 | Addiego |
| 5,949,901 A | 9/1999 | Nichani et al. |
| 6,137,303 A | 10/2000 | Deckert et al. |
| 6,140,254 A | 10/2000 | Endisch et al. |
| 6,147,357 A | 11/2000 | Nicolesco |
| 6,153,361 A | 11/2000 | Liu et al. |
| 6,314,379 B1 | 11/2001 | Hu et al. |
| 6,324,298 B1 | 11/2001 | O'Dell et al. |

(Continued)

*Primary Examiner* — Long Pham
(74) *Attorney, Agent, or Firm* — Dicke, Billig & Czaja, PLLC

(57) ABSTRACT

A loadport for handling film frames is disclosed. The loadport is modular and substantially compatible with applicable standards regarding modular equipment. In particular, the load port is substantially interchangeable with loadports not adapted for handling film frames. The loadport has a compact shuttle for moving film frames and flexible alignment mechanisms for aligning film frames and cassettes of different configurations.

17 Claims, 7 Drawing Sheets

(56) References Cited

U.S. PATENT DOCUMENTS

| | | |
|---|---|---|
| 6,412,326 B1 | 7/2002 | Hubbard et al. |
| 6,565,920 B1 | 5/2003 | Endisch |
| 6,640,151 B1 | 10/2003 | Somekh et al. |
| 6,708,074 B1 | 3/2004 | Chi et al. |
| 7,316,938 B2 | 1/2008 | Herrmann et al. |
| 8,097,966 B2 | 1/2012 | Herrmann et al. |
| 2003/0030050 A1 | 2/2003 | Choi |
| 2003/0202178 A1 | 10/2003 | Tsuji et al. |
| 2004/0071534 A1* | 4/2004 | Raymond ............... 414/416.01 |

* cited by examiner

US 8,698,327 B2

SUBSTRATE HANDLER

CROSS-REFERENCE TO RELATED APPLICATION

This application is a continuation in part of application Ser. No. 11/742,355, filed Apr. 30, 2007, now U.S. Pat. No. 8,097,966 which is a continuation of application Ser. No. 10/891,278 filed on Jul. 14, 2004 now U.S. Pat. No. 7,316,938 and claims priority to the provisional application Ser. No. 60/487,151 filed Jul. 14, 2003 and provisional application Ser. No. 61/567,634 filed on Dec. 7, 2011.

TECHNICAL FIELD OF THE INVENTION

The present invention relates generally to methods of and mechanisms for handling substrates and in particular to the handling of semiconductor substrates of various kinds.

BACKGROUND OF THE INVENTION

Manufacturers and users of semiconductor equipment rely upon standardized equipment specifications to ease system integration and factory design. An example of one such standard that is often relied upon is referred to as the BOLTS-M standard (SEMI E15, E63). This standard specifies a mechanical interface for mechanisms called loadports, among others, that are often coupled to equipment front-end modules (EFEM's) for handling semiconductor substrates. Loadports that are adapted to accommodate standard front opening unified pods (FOUP's) or cassettes can easily be made to meet the BOLTS-M standard as the robot in the EFEM is capable of reaching into the FOUP or cassette in the loadport to extract or replace wafers. Not so with wafers mounted on film frames.

Wafers on film frames tend to sag and pose a difficult handling proposition. Rather than using a spatulate end effector with a robot to pick up a film frame with a wafer or singlulated chips mounted thereon, a film frame handler extracts each film frame by sliding it from its cassette onto a platform. A specialized overhead end effector equipped system then picks up the film frame by applying vacuum against the upper surface of the film frame's frame and moves the film frame onto a top plate for processing, inspection, metrology, etc.

The footprint of mechanisms for reliably extracting and replacing film frames in a cassette is typically too large for incorporation into a BOLTS-M compatible loadport. Accordingly, film frame handlers tend to be specialized affairs that are typically single purpose, i.e. film frame only. Where provisions are made to handle wafers or substrates other than film frames, the flexibility and capability of such systems is necessarily limited to accommodate the film frame handling capability.

There is, therefore, a need for a modular loadport for handling substrates such as film frames or hoops that at least approximates the flexibility exhibited by substrate loadports that comply with industry standards such as the BOLTS-M standard.

DETAILED DESCRIPTION

Figure 1:
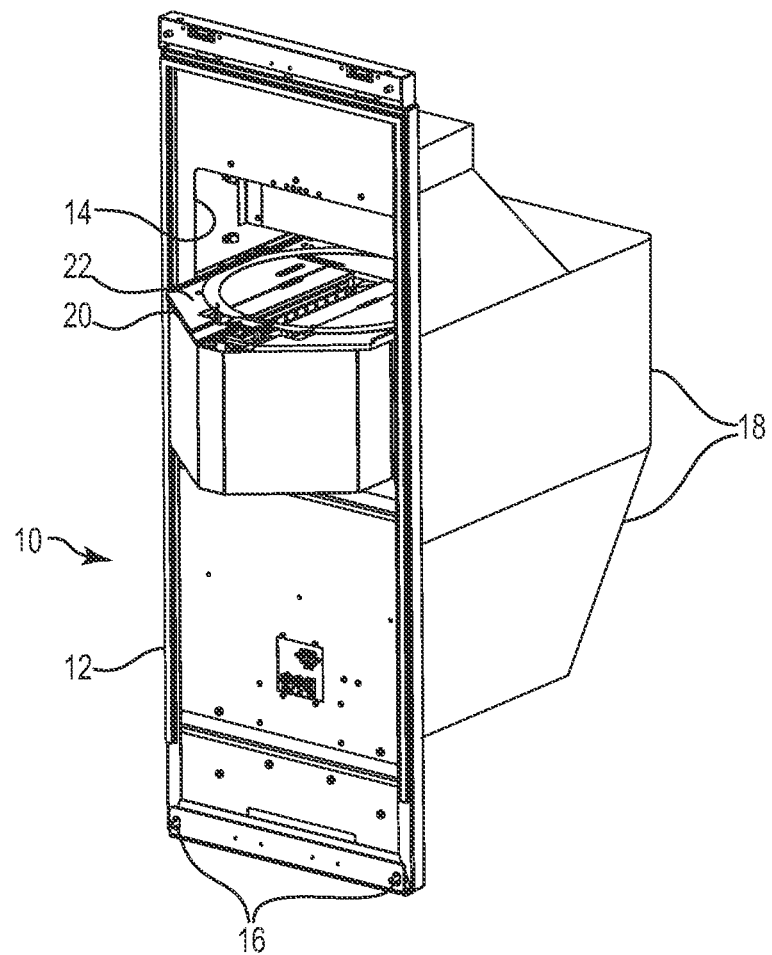
FIG. 1 illustrates one embodiment of a film frame loadport.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

FIG. 1 illustrates one embodiment of a film frame loadport 10 according to the principles of the present invention. In this Figure one can see a generally rectangular frame 12 having a port 14 formed therethrough. This port 14 aligns with a pass-through or aperture of an EFEM or other system or mechanism (not shown). The loadport 10 is attached to an EFEM by means of the frame 12. In one embodiment the loadport 10 may be secured to an EFEM or other mechanism by means of a number of fasteners such as bolts or quick release fasteners such as Cleco fasteners (not shown) that pass through a number of apertures 16 formed through the frame 12. Any useful number or arrangement of apertures 16 may be provided and in some embodiments hanging mechanisms such as a hook or lip may be provided in addition to or in lieu of such fasteners.

The loadport 10 shown in FIG. 1 includes shrouds 18 that cover at least some portion of the working components of the load port 10 to reduce the airflow around the covered components. Shrouds may also be used for safety purposes. The use of shrouds 18 minimizes contamination of substrates due to particles, grease, and other contaminants from the loadport components or from the environment in general. These shrouds 18 may have any useful configuration or may be omitted where the application does not require them.

Extending through the port 14 in the frame 12 is a film frame support 20. When film frames such as exemplary film frame 22 are extracted from a cassette (not shown), they are pulled onto the frame support. Film frames such as film frame 22 are well known to those skilled in the art as being a ring of fairly rigid material that forms a central aperture. Across this aperture is stretched an adhesive film to which is adhered a substrate such as a semiconductor substrate. As the ring of a film frame is not typically sufficiently rigid to support the film frame in a desired attitude when gripped solely at one edge, the film frame will be slide out of a cassette in which it is stored onto the film frame support 20. When a film frame 22 is slid onto a film frame support 20, a pair of slots that supports the film frame 22 in a cassette (not shown) is aligned with an upper surface of the film frame support 20 as described hereinbelow.

The film frame support 20 acts as a platform for an appropriate end effector to pick up and put down film frames 22. The film frame support 20 needn't extend far into the interior of an EFEM provided that an appropriate end effector is used. In one embodiment the film frame support 20 extends beyond the port 14 approximately the same depth as a diameter of a film frame 22 that will be handled. In some embodiments the frame support 20 may be longer than a film frame diameter, particularly where a large end effector on a robot or overhead transport device is utilized move film frames about in an EFEM. Where an overhead transport device is used to move film frames, the frame support 20 should extend approximately the same distance into the EFEM as the film frame's diameter. While it is not strictly necessary to constrain the length or projection of the film frame support 20 in this one embodiment to the diameter of a film frame, constraints on the lateral movement of an overhead transport device must be accommodated. Where such lateral movement constraints are satisfied, the film frame support's projection may vary. In other embodiments, such as where an end effector of a 3 or 4 axis robot of a type commonly used in the field is used, the film frame support may extend less than a diameter of a film frame 22 through the port 14.

Figure 6:
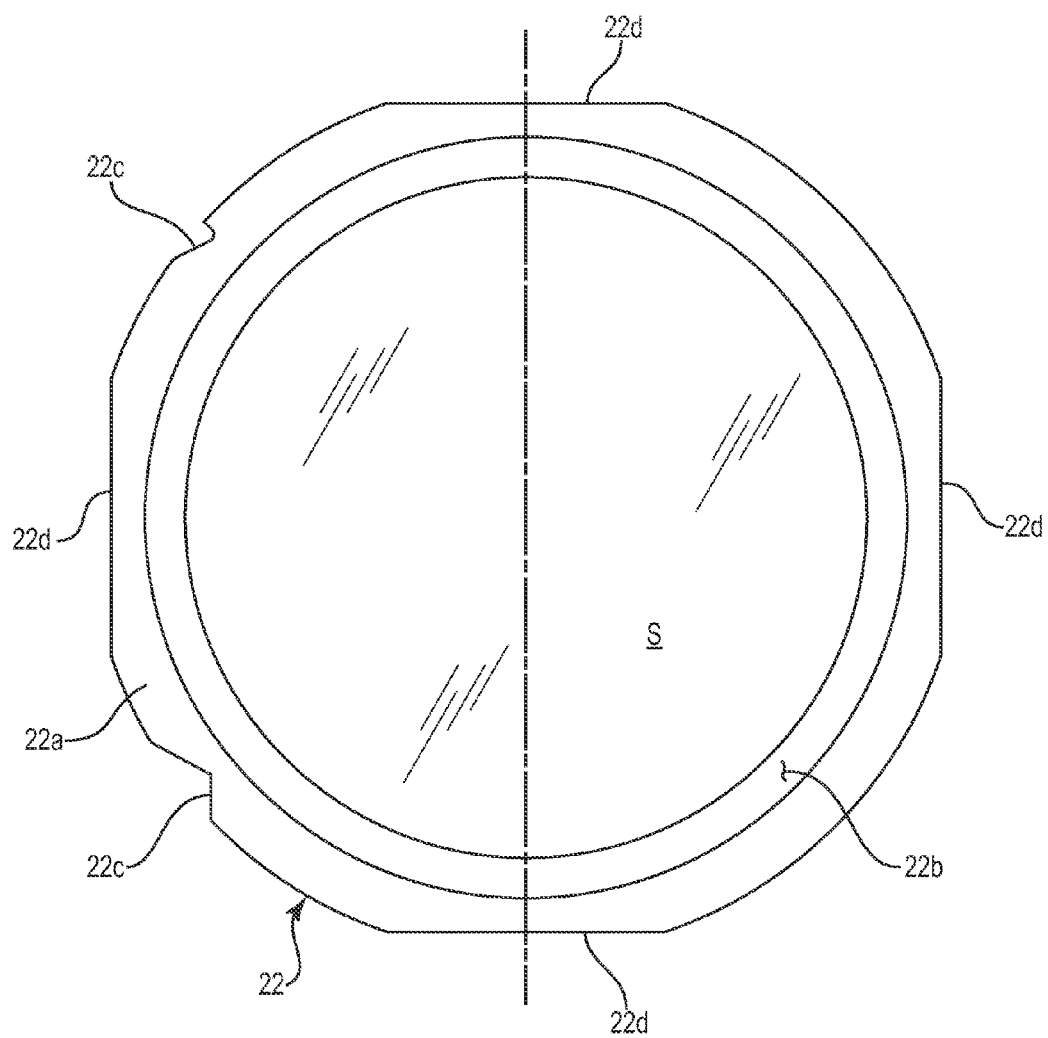
FIG. 6 illustrates an exemplary film frame of a type that may be handled by the present invention.

FIG. 6 illustrates an exemplary film frame 22 of a type that may be handled by the present invention. Note that the loadport 10 may be adapted to handle substrates other than film frames such as hoops or the like. Solid substrates such as silicon wafers or other discs (metallic or otherwise) may in some instances be handled by the load port 10, but care must be taken to prevent scratch these substrates as they slide on the film frame support 20. The film frame 22 is formed by a substantially rigid ring 22a. Stretched across this ring 22a is an adhesive film 22b. A wafer or other substrate "S" is adhered to the film in approximately the center of the ring 22b. The ring 22a has a pair of alignment notches 22c and one or more straight edges 22d that may be used to locate or guide a film frame 22. Those skilled in the art will recognize the generic nature of the film frame 22 of FIG. 6 and will appreciate that the many variations on this basis arrangement are or could in the future be in use. The loadport 10 of the present invention is flexible enough to accommodate many different variations in film frames 22 including different sizes such as for example 200 m, 300 mm or 450 mm film frames or hoops. Other sizes and configurations are also contemplated.

Referring next to FIGS. 7A-7E, one can see examples of end effectors and gripping devices that may be used to grip, grasp or otherwise secure for transport a film frame 22. Because film frames 22 are often not sufficiently rigid to support their own weight without deflecting, a simple pincer type frame gripper 30 affixed to a robot arm 31 such as that shown in FIG. 7E may not be sufficient, though for very small film frames or substrates this may not be the case. Larger pincer type grippers 32 such as those illustrated in FIG. 7D may be used for larger film frames. The larger, arcuate gripper 32 grips a larger portion of the periphery of the film frame 22 and hence reduces deformation of the film frame 22 when it is supported as compared to the gripper 30 shown in FIG. 7E.

Figure 9:
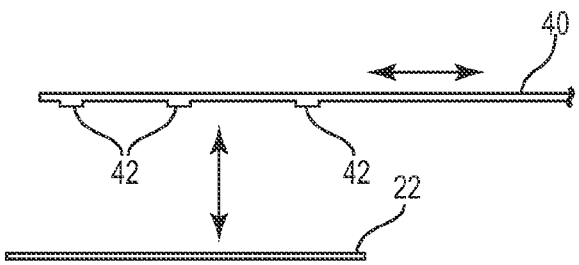
FIG. 9 illustrates how a generic end effector having vacuum devices may be addressed to a film frame from above.

A more secure way of handling a film frame 22, a hoop, or any other substrate to which the loadport 10 may be addressed is to use and end effector having vacuum devices to secure a film frame thereto. By way of explanation, an end effector is a mechanism that is either attached to or formed as part of a transport mechanism such as a robot arm or overhead transport system that is adapted to address and secure a substrate for movement or adjustment. A transport mechanism may be an overhead transport system or may be an arm or arms of a 3 or 4 axis robot of an EFEM. FIG. 9 illustrates how a generic end effector 40 having vacuum devices 42 may be addressed to a film frame 22 from above. In the context of the loadport 10, the film frame 22, supported on the film frame support is addressed by the end effector 40 from above. Note that an end effector utilizing a gripper such as grippers 30 or 32 may address the film frame 22 edge-on. Vacuum devices 42, which are essentially suction cups connected to at least a source of vacuum pressure, contact the non-substrate portion of a film frame 22 and are then activated by connecting the vacuum devices to the source of vacuum pressure. The activated vacuum devices 42 couple the film frame 22 to the end effector 40 which is then actuated to move the film frame 22 to a desired location, i.e. to remove the film frame 22 from the film frame support 20. Similarly, a film frame 22 may be returned to the film frame support 20 by the end effector 40.

Figure 7A:
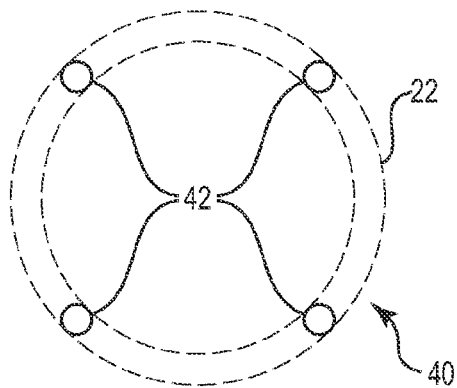
FIGS. 7A-7E show examples of end effectors and gripping devices that may be used to grip, grasp or otherwise secure for transport a film frame.
Figure 7B:
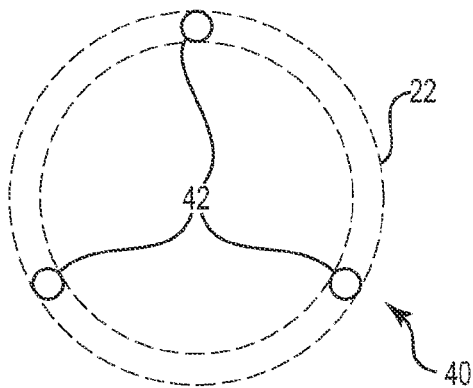
Figure 7C:
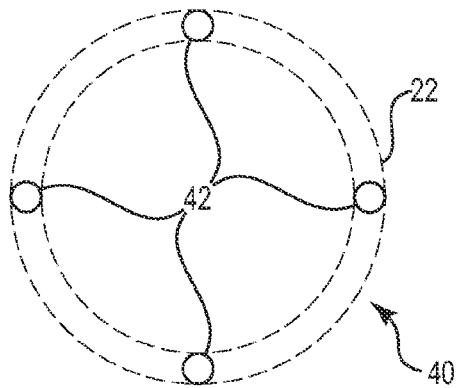
Figure 7D:
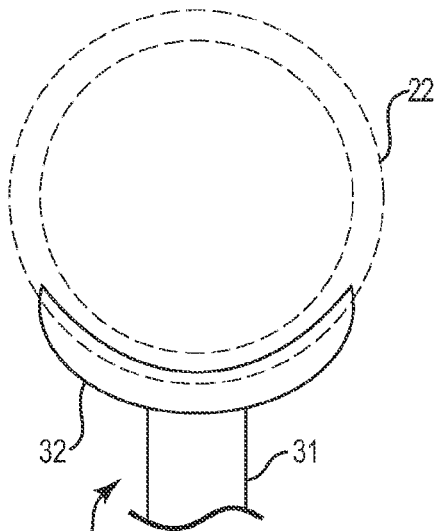
Figure 7E:
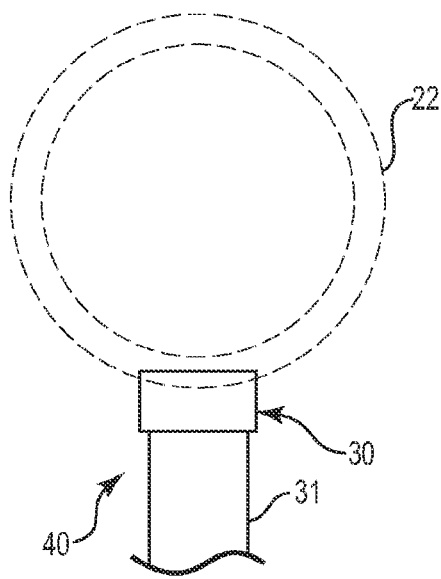

FIG. 7A schematically shows an embodiment of an end effector having four vacuum devices 42 that may be addressed to a film frame 22 (shown as dashed lines). FIG. 7B illustrates an embodiment having three vacuum devices 42. In a similar vein, FIG. 7C illustrates an embodiment in which two vacuum devices 42 are addressed to a film frame 22. It is noted that in FIG. 7C the vacuum devices are shown in solid line as being oriented horizontally and in dashed line as being oriented vertically. It is to be understood that for each embodiment shown in FIGS. 7A-7E, the end effector 40, the grippers 30 and 32, and the number, placement and orientation of the vacuum devices 42 may be modified to suit a given application. In some embodiments, the vacuum devices may be affixed to a spatulate end effector that is integral to a robot arm of a robot in an EFEM. In other embodiments, the end effector may be a separate portion removably attached to a distal end of a robot arm, the vacuum devices 42 being affixed to the end effector. End effectors may be spatulate, fork shaped, curvilinear, arcuate, or may approximate the size and shape of the film frame 22 or other substrate or holder that is being handled.

Figure 2:
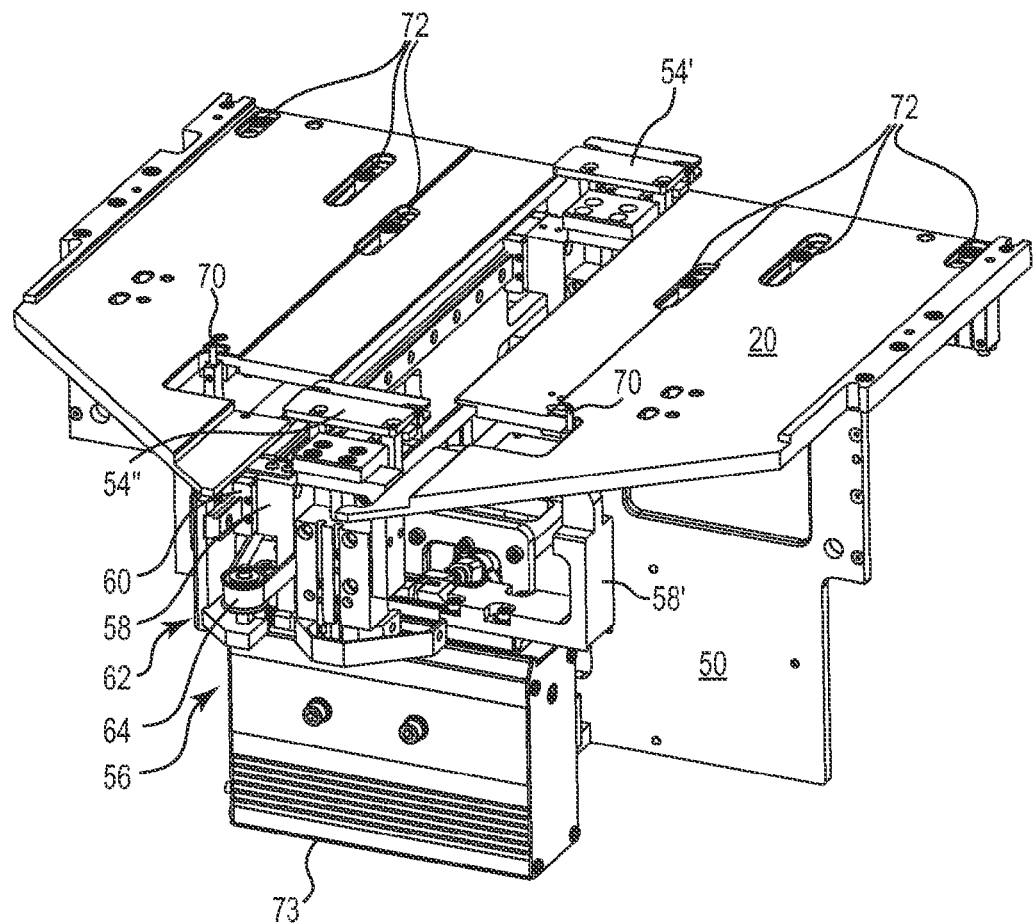
FIG. 2 shows one embodiment of a frame support coupled to a stiffener that is used to secure the frame support to the frame and to ensure that the frame support remains rigid and flat and in the desired plane.

FIG. 2 shows one embodiment of a frame support 20 coupled to a stiffener 50 that is used to secure the frame support 20 to the frame 12 and to ensure that the frame support 20 remains rigid and flat and in the desired plane. A retractable gripper is shown in a first position in which the retractable gripper may be addressed to the edge of a film frame (not shown) that is stored in a cassette (not shown). The retractable gripper in its first position denoted as 54'. FIG. 2 also includes a representation of the retractable gripper in a second position in which the gripper is positioned to address an edge of a film frame (not shown) that rests on the film frame support 20. The film frame addressed by the retractable gripper 54" may have been extracted from a cassette (not shown) or may have been newly placed on the film frame support 20 as having been returned from a processing, inspection or metrology step or process. Note that the gripper shown in the second position is denoted as 54" and is exemplary only. Only a single gripper 54 is provided. When the gripper 54 is in its second position it may be retracted downward below the upper surface of the frame support 20. In this way, a film frame 22 may be freely moved upon the surface of the frame support for alignment. Further, retracting the gripper 54 allows film frames 22 to be securely set down on the frame support 20 without worry of the gripper 54.

The gripper 54 is reciprocated between its first and second positions by a compact shuttle 56 that is positioned beneath the frame support 20. The shuttle 56 facilitates the fitment of the film frame loadport to a BOLTS-M standard EFEM by doing away with the large reciprocating mechanisms that previously took up so much space.

In one embodiment the shuttle 56 has a body 58 that travels on a linear bearing 60. The position of the body 58 may be determined using a linear encoder (not shown) coupled between the body 58 and the frame support 22. In other embodiments a rotary encoder (not shown) may be coupled to an actuating mechanism 62 to determine a position of the gripper 54. The body 58 may be moved in a number of different types of actuating mechanism 62 ways including the use of a toothed belt 64 or a ball screw (not shown). These and other embodiments for moving the body 58 may be selected as needed for a particular application.

The retractable gripper 54 is coupled to the body 58 for vertical or near vertical travel in a straight or curvilinear line with respect to the upper surface of the film frame support 20. A small actuator 66 moves, i.e. extends and retracts, the gripper 54 up and down as the operation of the system requires. The gripper 54 may also rotate in a plane defined by the first and second positions of the gripper 54 to some degree to prevent or at least minimize the rotation of a film frame when it is grasped by the gripper 54. The idea here is to grip the film frame and then actuate the movement of the body 58 from the first to the second position whilst retaining the film frame in a substantially planar orientation with respect to the frame support 20.

Figure 3:
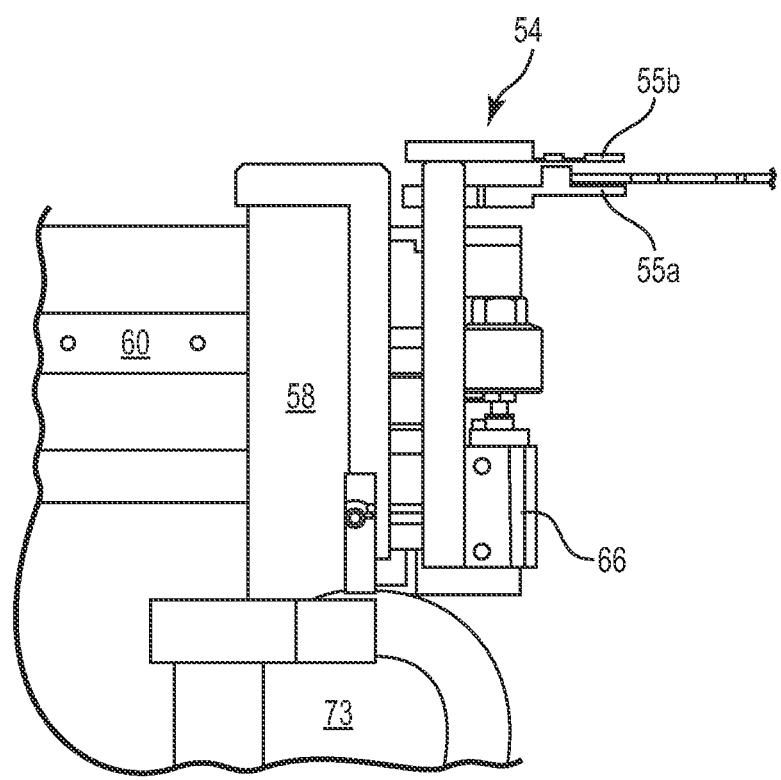
FIG. 3 shows the upper jaw of the gripper is adjustable with respect to the lower jaw to the extent necessary to accommodate film frames or hoops of differing thicknesses.

The lower jaw 55a of the gripper 54 may in some embodiments be reciprocal but is in other embodiments stationary. The upper jaw 55b of the gripper 54 is adjustable with respect to the lower jaw 55a to the extent necessary to accommodate film frames or hoops of differing thicknesses as seen in FIG. 3.

Film frames are preferably coarse aligned by the film frame loadport 10 as the film frame may not easily be placed on a standard pre-aligner. As with U.S. Pat. No. 7,316,938, a continuation of which is co-pending herewith and from which this application claims priority as a continuation in part, pusher pins 70 are used to push the film frame into a first alignment position. As can be seen in FIG. 2, an adjustable set of pusher pins 70 provided for pushing a film frame 22 into contact with a selected set of alignment pins 72. Each of the pins 70 is mounted on an adjustment mechanism 73 that moves the pins toward and away from one another in a generally symmetrical manner in a direction that is generally perpendicular to the travel of the gripper 54 in the plane of the frame support 20. The pins 70 are adjustable to accommodate film frames of different sizes.

The adjustment mechanism 73 is in one embodiment rotatably mounted to the frame 12 (not shown in FIG. 2) such that the pins 70 mounted there on can move and reciprocate in the same direction as the motion of the gripper 54. Note that in other embodiments the adjustment mechanism may move linearly instead of rotatably. The adjustment mechanism 73 is in one embodiment an actuator that moves the pins 70 laterally with respect to the direction of travel of the gripper 54. The adjustment mechanism 73 is caused to rotate or reciprocate by an actuator (not shown) coupled between the frame 12 and the adjustment mechanism 73.

Typically film frames have alignment notches 22c formed into their sides that have the same spacing as selected alignment pins 72. The pins 70 are adjusted to contact a curvilinear portion of the edge of a film frame to reliably guide the alignment notches 22c of film frame 22 into contact with the alignment pins 72. The pusher pins 70 reciprocate toward one of a number of sets of alignment pins that may be extended above the surface of the frame support as needed and retracted below the surface when not. During alignment, the set of alignment pins appropriate for the size and/or configuration of the film frame or hoop are extended above the surface of the frame support 20 and the pusher pins 70 that push the film frame or hoop into contact with the stop pins to achieve a first alignment. The adjustability of the alignment pins is not strictly required as a first alignment may be performed using manually adjustable or non-adjustable alignment pins 72. However, the automatic adjustability of the alignment pins 72 and of the pusher pins 70 does allow for rapid implementation of new product recipes or set ups. For example, a recipe or product set up may include information regarding the size of a film frame contained in a cassette such that when the cassette is loaded, the appropriate pusher or alignment pins are selected and used automatically without user input. In other instances, a cassette may be loaded with film frames having various form factors and/or or alignment notch 22c spacing. The automatic adjustment of the pins 70, 72 allows for the continuous inspection or processing of film frames or hoops even where different form factor frames or hoops are included in a single cassette.

Alignment pins 72 may be reciprocated between an extended position in which they extend above the surface of the film frame support 20 and a retracted position in which the pins 72 are positioned below the surface of the film frame support by any useful means. In one embodiment pneumatic actuators move the alignment pins between their extended and retracted positions as needed. These pneumatic actuators may be plumbed for control as respective pair of alignment pins 72 or controlled individually to be extended or retracted as needed alone or in pairs.

Figure 4:
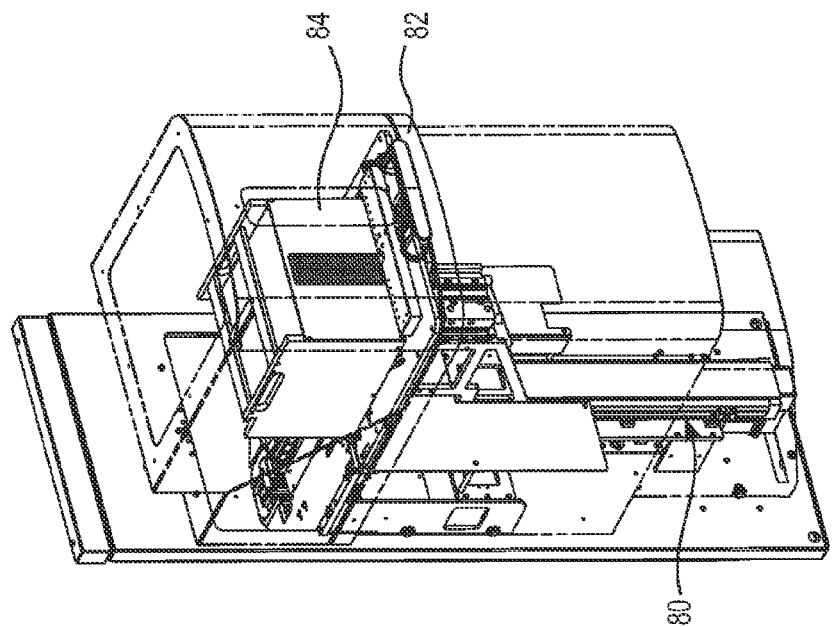
FIGS. 4 and 5 show an elevator, a cassette plate, and cassettes.
Figure 5:
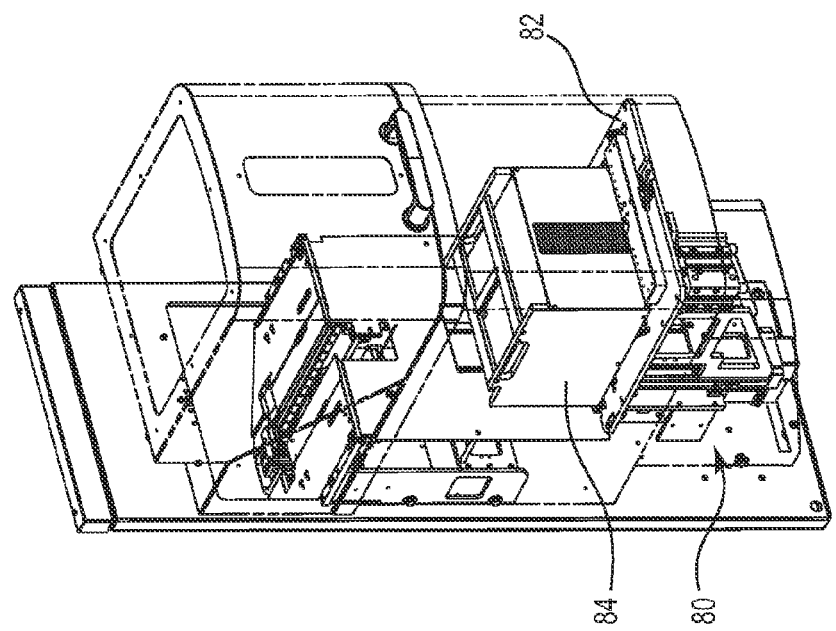

FIGS. 4 and 5 show an elevator 80, a cassette plate 82, and cassettes 84. The film frame loadport 10 has on its outboard side an elevator 80 that supports a cassette plate 82. Cassettes 84 secured to the cassette plate 82 are moved vertically with respect to the port 14 through the frame 12 and to the frame support 50. Generally the cassette 84 is moved so that a pair of slots (not shown) in the cassette that house and support a film frame 22 or similar type of frame or hoop is aligned with the frame support 20. To remove a film frame from the cassette 84, the gripper 54 is moved to its first position in which the upper jaw 55b and lower jaw 55a of the gripper 54 have and edge of the film frame positioned therebetween. At least the upper jaw 55b of the gripper 54 is extended above the surface of the frame support 20 and the lower jaw 55a of the gripper is preferably planar parallel to the upper surface of the film frame support 20, though in some embodiments the elevator will position the film frame 22 such that the lower jaw 55a which is positioned slightly above the film frame support 20 may address the edge of the film frame 22. The jaws of the gripper 54 are then actuated to grasp the film frame 22. In this embodiment the lower jaw 55a remains stationary and the upper 55b moves, but it is to be understood that the case may be reversed or both jaws may move.

The elevator 80 has associated therewith a linear or rotary encoder (not shown) to accurately identify the position of the cassette with respect to the frame support 20. Further, the elevator 80 is provided with a sensor that can optically or capacitatively determine whether a film frame, hoop or wafer is present in the cassette 84, in which slot, and whether there are any cross-slotting issues. Generally when a cassette 84 is first placed on the cassette plate 82, the elevator 84 will be vertically cycled to allow the sensor (which is often but not always coupled to the frame 12 (directly or indirectly) so as to remain stationary as the elevator 80 is cycled) to map the position of all film frames 22 in the cassette 84. Note that in some embodiments the sensor may move for the mapping procedure while the elevator and cassette remain stationary.

Figure 8:
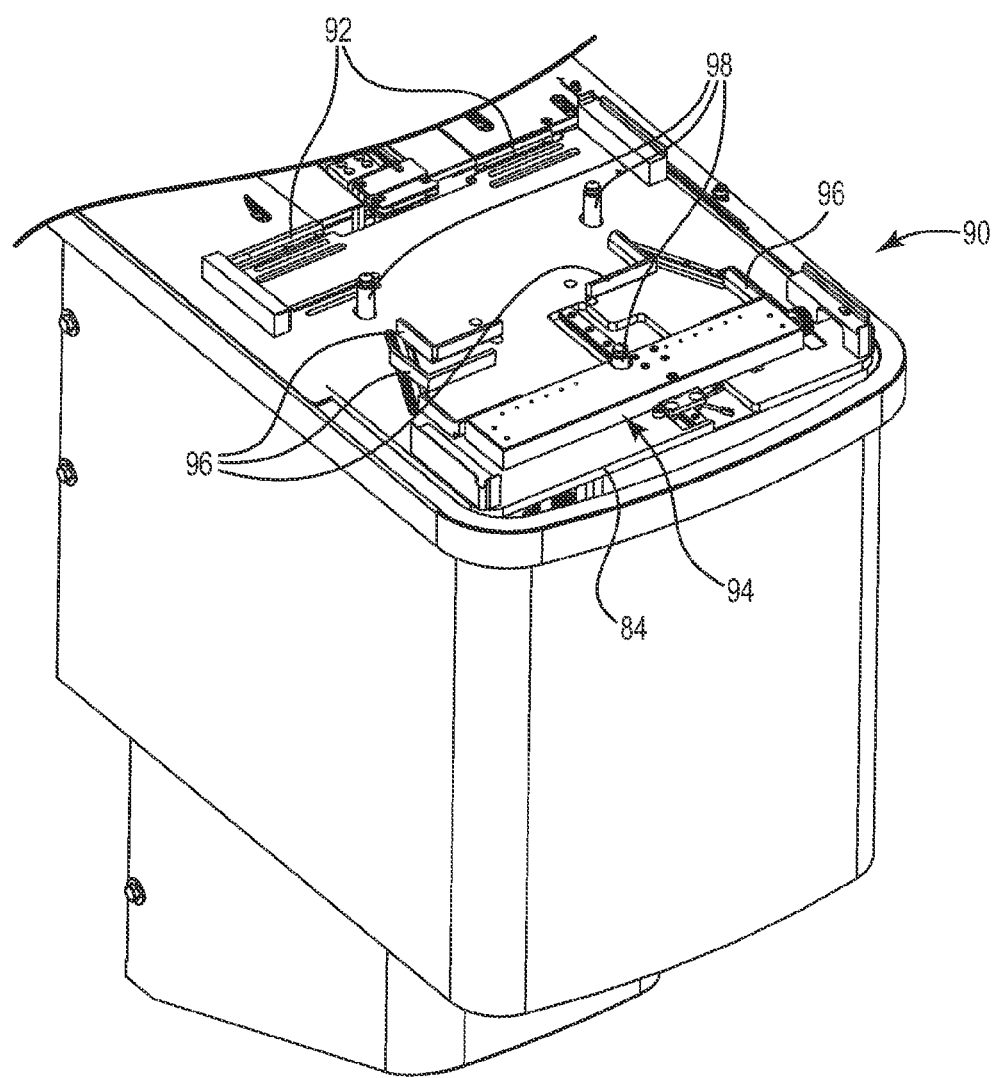
FIG. 8 shows one embodiment of a cassette plate provided with an automatic cassette alignment mechanism.

It is important to ensure that a cassette 84 placed on the cassette plate 82 remains in an aligned position. To do this, one embodiment of the cassette plate 82 is provided with an automatic cassette alignment mechanism 90 as seen in FIG. 8. In one embodiment, the forward stops 92 at the front edge of the cassette plate 82 create a positive alignment at the front edge of the cassette 84 with respect to the cassette plate 82. The actuation of the actuating mechanism causes the appropriate corner grippers 96 to clamp the cassette 84 into the desired position. Note that the foregoing actuating mechanism 94 and stops 92 are typically used in the 200 mm cassette operations but other size cassettes 84 may be accommodated.

The retractable cassette alignment pins 98 may be extended above the cassette plate where appropriate to act as a standard three pin kinematic mount for a 300 mm FOUP or cassette 84.

Operation of the whole is coordinated by a controller (not shown) that may take the form of a personal computer connected for local control, a computing device or computer that is located remotely from the load port 10 and connected via any useful networking protocol (wireless or wired), or a distributed computing device having multiple elements coupled to the loadport 10. For example, in one embodiment an industrial computer located within an EFEM to which a loadport 10 is coupled controls the operation of the loadport 10. In addition to local or remote control of the loadport and its mechanisms, databases or stores of data or information may be maintained remotely and served up as needed to allow for the automatic operation and adjustment of the loadport 10 and its elements. The loadport 10 may then operation in conjunction with the EFEM and whatever inspection, metrology or process tool or tools that are coupled to the EFEM. Control and information such as recipes may be handled locally or remotely through a fab-wide host system as is well understood by those skilled in the art.

CONCLUSION

Although specific embodiments of the present invention have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A semiconductor substrate handling mechanism comprising:
    an alignment plate having a first end and a second end;
    a control mechanism moveable between the first end of the alignment plate and the second end of the alignment plate, the control mechanism being addressed to a semiconductor substrate when positioned at the first end of the alignment plate and being located below an upper surface of the alignment plate when positioned at the second end of the alignment plate, the travel of the control mechanism between its first and second positions being greater than a dimension of the semiconductor substrate;
    an alignment mechanism extendable through the upper surface of the alignment plate between a first, extended position in which a semiconductor substrate resting on the alignment plate may be biased into contact with the alignment mechanism and a second, retracted position; and,
    a bias mechanism extendable through the upper surface of the alignment plate between a first, extended position and a second, retracted position, the bias mechanism moveable toward and away from the alignment mechanism when in its first position.

2. The semiconductor substrate handling mechanism of claim 1 wherein the handling mechanism is coupled to a substrate handler using a modular connector pattern.

3. The semiconductor substrate handling mechanism of claim 1 wherein the alignment plate is at least partially split to allow the control mechanism to move between its first and second positions.

4. The semiconductor substrate handling mechanism of claim 1 wherein the control mechanism may reciprocate between an upper position above the upper surface of the alignment plate and a lower position below the surface of the alignment plate.

5. The semiconductor substrate handling mechanism of claim 1 wherein the alignment mechanism comprises a plurality of sets of pins, each set of pins positioned in the alignment plate to define an aligned position for a semiconductor substrate of a size that corresponds to a selected one set of pins of the alignment mechanism.

6. The semiconductor substrate handling mechanism of claim 1 further comprising a controller for coordinating the operation of the control mechanism, the alignment mechanism and the bias mechanism, the controller being communicatively connected to each of the control mechanism, the alignment mechanism, and the bias mechanism.

7. The semiconductor substrate handling mechanism of claim 1 wherein the alignment mechanism further comprises spaced apart bearing surfaces mounted on an adjustment mechanism for changing the distance between the bearing surfaces.

8. The semiconductor substrate handling mechanism of claim 6 wherein the control mechanism is in contact with a host controller external to the handling mechanism and wherein the host controller provides instructions to the local system regarding the size and position of the semiconductor substrate.

9. The semiconductor substrate handling mechanism of claim 1 wherein the alignment plate is located adjacent to an opening in the substrate handling mechanism such that a substrate handler may address an aligned semiconductor substrate on the alignment plate.

10. The semiconductor substrate handling mechanism of claim 9 wherein the substrate handler is adapted to both pick up and drop off a semiconductor substrate.

11. The semiconductor substrate handling mechanism of claim 10 wherein the substrate handler has a vacuum end effector.

12. The semiconductor substrate handling mechanism of claim 10 wherein the substrate handler has a spatulate end effector.

13. The semiconductor substrate handling mechanism of claim 1 wherein the alignment plate has its first end located external to a handling system and its second end positioned within the handling system.

14. The semiconductor substrate handling mechanism of claim 1 wherein the alignment plate is entirely within the handling system.

15. The semiconductor substrate handling mechanism of claim 1 wherein the substrate handler of the handling system is selected from a group consisting of a two axis robot located in a fixed position; a three axis robot; a robot of two or three axes on a translate stage; and an overhead substrate handling system moving along an overhead rail system within the handling system.

16. The semiconductor substrate handling mechanism of claim 1 wherein the alignment plate comprises a pair of plates aligned so as to be coplanar and to define a channel therebetween within which the control mechanism moves between its first and second positions.

17. A modular loadport for supplying film frames to a wafer handling system comprising:
- a frame that may be secured to the wafer handling system at a port formed through a wall of the wafer handling system;
- an elevator coupled to the frame for vertical movement;
- a cassette support mounted on the elevator, the cassette support having at least one mounting device for securing a cassette thereto;
- a slide secured to the frame so as to pass at least partially through the port of the wafer handling system, the slide having an upper planar surface that is substantially planar parallel with at least one surface defined by a cassette mounted on the cassette support;
- a gripper positioned in a channel formed in the slide, the gripper being reciprocal between a first position in which the gripper is addressed to an edge of a film frame in a cassette secured to the cassette support and a second position in which the gripper is positioned away from the cassette, the gripper being actuated between its first and second positions by an actuator that does not extend beyond a distal end of the slide.

* * * * *

UNITED STATES PATENT AND TRADEMARK OFFICE
CERTIFICATE OF CORRECTION

| | |
|---|---|
| PATENT NO. | : 8,698,327 B2 |
| APPLICATION NO. | : 13/352160 |
| DATED | : April 15, 2014 |
| INVENTOR(S) | : Troy Palm et al. |

It is certified that error appears in the above-identified patent and that said Letters Patent is hereby corrected as shown below:

In the Specification

Column 1, line 8, delete "continuation" and insert in place thereof --divisional--.

Column 1, line 39, delete "singlulated" and insert in place thereof --singulated--.

Column 3, line 25, before "may" insert --20--.

Column 3, line 46, delete "200 m" and insert in place thereof --200 mm--.

Column 4, line 13, before "to" insert --42--.

Column 4, line 31, before "may" insert --42--.

Column 5, line 65, before "that" insert --72--.

Column 7, line 8, before "causes" insert --94--.

Signed and Sealed this
Seventeenth Day of February, 2015

Michelle K. Lee
*Deputy Director of the United States Patent and Trademark Office*